(12) United States Patent
Dogiamis et al.

(10) Patent No.: US 10,921,349 B2
(45) Date of Patent: Feb. 16, 2021

(54) PIEZOELECTRIC PACKAGE-INTEGRATED CURRENT SENSING DEVICES

(71) Applicant: Intel Corporation, Santa Clara, CA (US)

(72) Inventors: Georgios C. Dogiamis, Chandler, AZ (US); Adel A. Elsherbini, Chandler, AZ (US); Shawna M. Liff, Scottsdale, AZ (US); Johanna M. Swan, Scottsdale, AZ (US); Jelena Culic-Viskota, Gilbert, AZ (US); Thomas L. Sounart, Chandler, AZ (US); Feras Eid, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 16/096,968

(22) PCT Filed: Jul. 1, 2016

(86) PCT No.: PCT/US2016/040844
§ 371 (c)(1),
(2) Date: Oct. 26, 2018

(87) PCT Pub. No.: WO2018/004689
PCT Pub. Date: Jan. 4, 2018

(65) Prior Publication Data
US 2019/0113545 A1 Apr. 18, 2019

(51) Int. Cl.
*G01R 15/20* (2006.01)
*H01L 41/06* (2006.01)
(Continued)

(52) U.S. Cl.
CPC .............. *G01R 15/20* (2013.01); *G01R 15/14* (2013.01); *G01R 15/205* (2013.01);
(Continued)

(58) Field of Classification Search
CPC ...... G01R 15/20; G01R 15/14; G01R 15/247; G01R 15/205; H01L 41/125; H01L 41/06;
(Continued)

(56) References Cited

U.S. PATENT DOCUMENTS 4,500,838 A * 2/1985 Bloomer .............. G01R 15/148
310/328
6,563,079 B1 * 5/2003 Umetsu ................ H01L 21/486
219/121.71
(Continued)

OTHER PUBLICATIONS

International Search Report and Written Opinion for International Patent Application No. PCT/US2016/040844 dated Jan. 10, 2017, 13 pgs.
(Continued)

*Primary Examiner* — Vinh P Nguyen
(74) *Attorney, Agent, or Firm* — Schwabe, Williamson & Wyatt, P.C.

(57) ABSTRACT

Embodiments of the invention include a current sensing device for sensing current in an organic substrate. The current sensing device includes a released base structure that is positioned in proximity to a cavity of the organic substrate and a piezoelectric film stack that is positioned in proximity to the released base structure. The piezoelectric film stack includes a piezoelectric material in contact with first and second electrodes. A magnetic field is applied to the current sensing device and this causes movement of the released base structure and the piezoelectric stack which induces a voltage (potential difference) between the first and second electrodes.

22 Claims, 8 Drawing Sheets

(51) Int. Cl.
 *G01R 15/14* (2006.01)
 *H01L 41/113* (2006.01)
 *G01R 15/24* (2006.01)
 *H01L 41/12* (2006.01)

(52) U.S. Cl.
 CPC ............ *G01R 15/247* (2013.01); *H01L 41/06* (2013.01); *H01L 41/1132* (2013.01); *H01L 41/125* (2013.01)

(58) Field of Classification Search
 CPC ... H01L 41/1132; H01L 23/585; H01L 23/50; H01L 27/1218; H01L 27/1222; H01L 27/124; H01L 29/0665; H01L 41/18; G06F 19/00; G01N 2291/2697
 See application file for complete search history.

(56) References Cited

U.S. PATENT DOCUMENTS

| | | |
|---|---|---|
| 6,809,515 B1 | 10/2004 | Li et al. |
| 7,345,475 B2 | 3/2008 | Takeuchi et al. |
| 2013/0249545 A1 | 9/2013 | Horsley et al. |
| 2015/0168503 A1* | 6/2015 | Kim .................. G01R 33/0286 324/244 |

OTHER PUBLICATIONS

International Preliminary Report on Patentability for International Patent Application No. PCT/US2016/040844, dated Jan. 10, 2019, 11 pages.

* cited by examiner

PIEZOELECTRIC PACKAGE-INTEGRATED CURRENT SENSING DEVICES

CROSS-REFERENCE TO RELATED APPLICATION

This patent application is a U.S. National Phase Application under 35 U.S.C. § 371 of International Application No. PCT/US2016/040844, filed Jul. 1, 2016, entitled "PIEZOELECTRIC PACKAGE-INTEGRATED CURRENT SENSING DEVICES," which designates the United States of America, the entire disclosure of which is hereby incorporated by reference in its entirety and for all purposes.

FIELD OF THE INVENTION

Embodiments of the present invention relate generally to package integrated current sensing devices. In particular, embodiments of the present invention relate to piezoelectric package integrated current sensing devices.

BACKGROUND OF THE INVENTION

Current sensing is useful in today's packages because it enables package testing in-situ. In-situ package testing is useful for test modules when troubleshooting the effect of test parameters on the actual performance of the product. In one example, a random package ball grid array (BGA) melting may occur under high temperature and high voltage stress conditions, resulting in yield loss and requiring test module collaterals repair.

Conventional current sensing methods (for AC or DC) include a first method of sensing over resistor voltage drop relying on Ohm's law (V=I*R) and a second method of inductive transducers in which a current conductor passes through a magnetically permeable core that "magnifies" the conductor's magnetic field. AC current creates a time varying magnetic field around the conductor. By placing a coil around the current conductor, the generated magnetic field induces current in the coil windings that can be measured. A third method is Hall effect current sensing that is used for DC currents mainly. Hall sensors tend to be more expensive than shunt or inductive transducers. The Hall sensors are difficult to integrate with embedded sensors.

The first method is a sensing method that requires contact with the conductive trace. Hence in current sensing applications where the current conductor/trace is not fully exposed (i.e., buried in one of the package layers) this method will not work. Additionally, the traces will need to be electrically coupled which can be problematic, for example, when sensing currents through high voltage lines or noise sensitive lines.

The second and third methods are non-contact current sensing technologies. However in order for these methods to be applied, access to the trace has to be facilitated so as to surround the current conductor with either the coil or the Hall sensor. The coil can be integrated into the package. However, this would require three available layers around the trace and thus limits the application (requires at least three layer package and available layers above and below). Moreover, one coil per trace/sensor is needed. Therefore, in applications where the trace is not exposed, these methods render themselves useless.

DETAILED DESCRIPTION OF THE INVENTION

Figure 1:
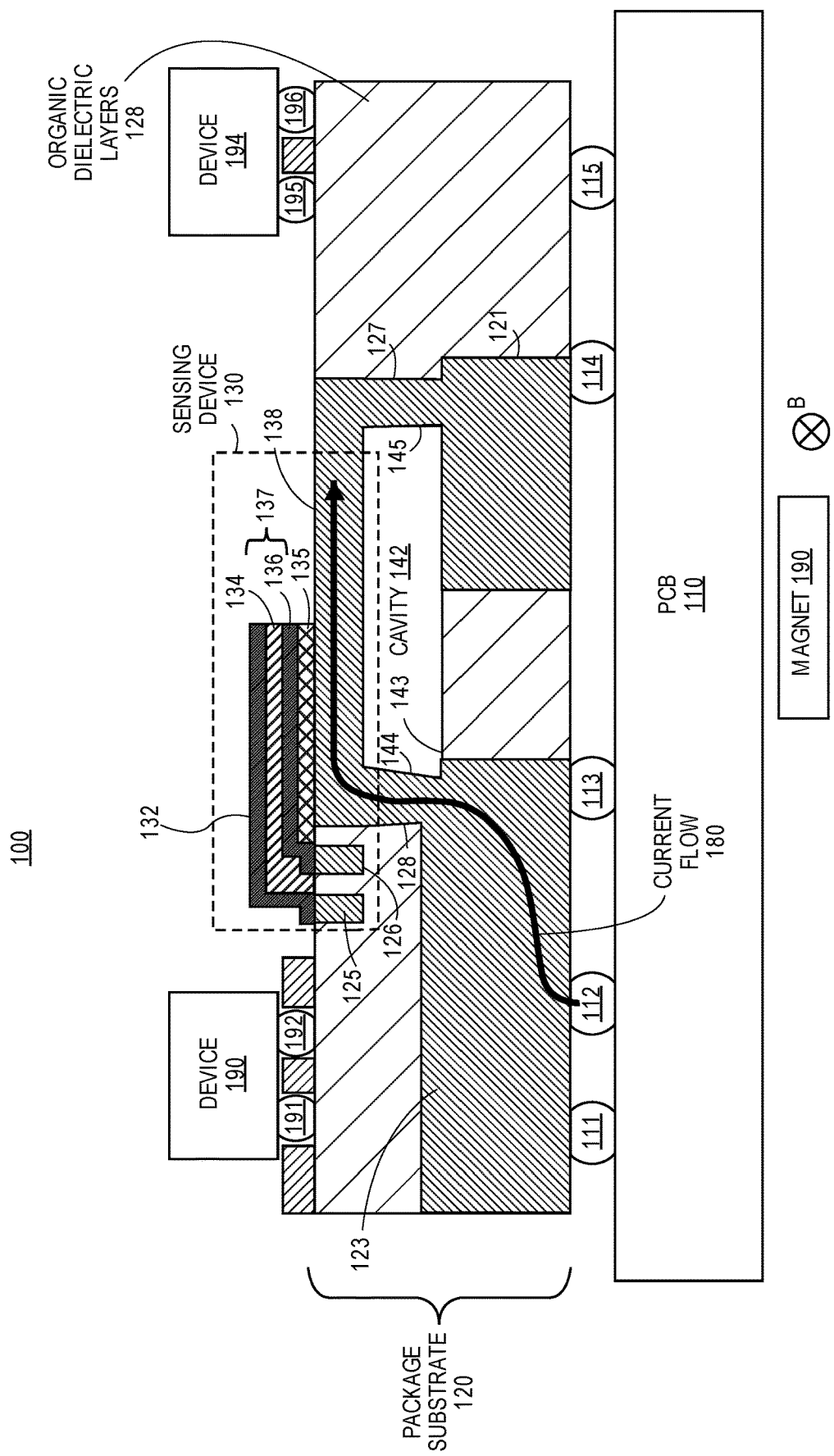
FIG. 1 illustrates a view of a microelectronic device 100 having a package-integrated piezoelectric current sensing device, according to an embodiment.

Described herein are piezoelectric package integrated current sensing devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Ideally, a non-contact current sensing technique is desired that neither impacts the electrical characteristics of the trace (by inserting a resistor for example) nor the design of the system by limiting the measurement of current to only the traces in the outer layers of a package. Moreover, in many CPU packages and SoCs, the current-carrying power traces are typically split throughout the package in a power grid pattern to provide all the supply voltage and ground connections, which are typically scattered throughout the entire die (e.g., system on chip (SoC)). Therefore, sensing localized currents with conventional methods is impossible.

The present design provides an in-situ novel method of current sensing to improve the quality of packages and provide insight into the operating conditions (e.g., maximum allowed current) to be applied during product testing. The technology of the present design enables the creation of package-integrated current sensors based on a hybrid piezoelectric-electromagnetic principle. These sensors are manufactured using panel level processing, thus enabling low cost and the advantage of being integrated directly into the package substrate.

The present design provides thin, low cost current sensors that are manufactured as part of an organic package substrate traditionally used to route signals between the CPU or other die and the board. The present design allows the fabrication of in-package current sensors based on a novel piezoelectric-electromagnetic principle utilizing substrate manufacturing technology. These sensors include released traces (e.g., length L≤2 mm, length L from 0.5 to 2 mm) that are free to move in the presence of a magnetic field once a current I passes through the trace creating an electromagnetic force on the trace. These traces are part of the substrate conductive layers (e.g., copper) and are made free to move by removing the dielectric material around them. The released traces also contain stacks of piezoelectric material and electrodes that are mechanically coupled to the traces. An output voltage is generated across the stack electrodes due to the piezoelectric effect once the traces deflect under the action of the electromagnetic force. This output voltage is read out and used to determine the corresponding current applied through the trace.

When a current I (AC or DC) passes through a free-standing trace of length L in the presence of a magnetic field B, an electromagnetic (Lorentz) force $F=B*I*L$ is generated which is proportional to the current I and the magnetic field B. Assuming that B is constant, the force will be proportional to the flowing current I. This force will cause the trace and the piezoelectric stack to which it is mechanically coupled to move or deflect. The deformation of the piezoelectric material will generate a voltage which can be measured and correlated to the applied current I.

The present design results in package-integrated current sensing devices thus enabling a non-contact current sensing method with tight integration and directly created as part of the substrate itself with no need for assembling external components. This is an important novel functionality since no accurate existing method for package-integrated current sensing across internal/inaccessible substrate traces is currently known. This present design can be manufactured as part of the substrate fabrication process with no need for assembling discrete components. It therefore enables high volume manufacturability (and thus lower costs) of systems that need localized current sensing.

Package substrate technology using organic panel-level (e.g., ~0.5 m×0.5 m sized panels) high volume manufacturing (HVM) processes has significant cost advantages compared to silicon-based MEMS processes since it allows the batch fabrication of more devices using less expensive materials. However, the deposition of high quality piezoelectric thin films has been traditionally limited to inorganic substrates such as silicon and other ceramics due to their ability to withstand the high temperatures required for crystallizing those films. The present design is enabled by a new process to allow the deposition and crystallization of high quality piezoelectric thin films without degrading the organic substrate.

In one example, the present design includes package-integrated structures to act as current sensing devices. Those structures are manufactured as part of the package layers and are made free to vibrate or move by removing the dielectric material around them. The structures include piezoelectric stacks that are deposited and patterned layer-by-layer into the package. The present design includes creating current sensing devices in the package on the principle of suspended and moveable structures. Etching of the dielectric material in the package occurs to create cavities. Piezoelectric material deposition (e.g., 0.5 to 1 um deposition thickness) and crystallization also occurs in the package substrate during the package fabrication process. An annealing operation at a substrate temperature range (e.g., up to 260° C.) that is lower than typically used for piezoelectric material annealing allows crystallization of the piezoelectric material (e.g., lead zirconate titanate (PZT), potassium sodium niobate (KNN), aluminum nitride (AlN), zinc oxide (ZnO), etc) to occur during the package fabrication process without imparting thermal degradation or damage to the substrate layers. In one example, laser pulsed annealing occurs locally with respect to the piezoelectric material without damaging other layers of the package substrate (e.g., organic substrate) including organic layers.

Referring now to FIG. 1, a view of a microelectronic device 100 having package-integrated piezoelectric current sensing devices is shown, according to an embodiment. In one example, the microelectronic device 100 includes multiple devices 190 and 194 (e.g., die, chip, CPU, silicon die or chip, radio transceiver, etc.) that are coupled or attached to a package substrate 120 with solder balls 191-192, 195-196. The package substrate 120 may be coupled or attached to the printed circuit board (PCB) 110 using, for example, solder balls 111 through 115.

The package substrate 120 (e.g., organic substrate) includes organic dielectric layers 128 and conductive layers 121, 123-128, 132, 136, and 138. Organic materials may include any type of organic material such as flame retardant 4 (FR4), resin-filled polymers, prepreg (e.g., pre impregnated, fiber weave impregnated with a resin bonding agent), polymers, silica-filled polymers, etc. The package substrate 120 can be formed during package substrate processing (e.g., panel level). The panels formed can be large (e.g., having in-plane (x, y) dimensions of approximately 0.5 meter by 0.5 meter, or greater than 0.5 meter, etc.) for lower cost. A cavity 142 is formed within the packaging substrate 120 by removing one or more layers (e.g., organic layers, dielectric layers, etc.) from the packaging substrate 120. The cavity 142 includes a lower member 143 and sidewalls 144-145. In one example, a piezoelectric current sensing device 130 is formed with conductive structures 132, 136, 138 (e.g., cantilevers, beams) and piezoelectric material 134 sandwiched between them. The three structures 132, 134, and 136 form a stack 137. The conductive structure 132 can act as a first electrode and the conductive structure 136 can act as a second electrode of the piezoelectric device. The cavity 142 can be air filled or vacuum filled.

The base structure 138 (e.g., released membrane or trace 138) is free to move in a vertical direction (e.g., along a z-axis). It is anchored on the cavity edges by package vias 128 and 127 which serve as both mechanical anchors as well as electrical connections to the rest of the package.

The device 130 includes a structure 138 (e.g., trace) that is free to move in the horizontal or vertical direction and is surrounded by a cavity. The structure 138 (e.g., trace) can be patterned as part of one of the substrate conductive layers and can include copper or other conductive material. Organic dielectric normally surrounds copper traces in packages/PCBs; however this organic material is removed around the trace in FIG. 1 to allow it to move. The trace is also mechanically coupled to a piezoelectric stack 137 that includes a piezoelectric material such as PZT, KNN, ZnO, or other materials sandwiched between conductive electrodes. A separate conductive material 132 or 136 is used for the first electrode after depositing an insulating layer to electrically decouple this first electrode from the conductive trace 138.

To measure current (AC or DC) passing through the structure 138, initially an external magnetic field needs to be applied to a region in proximity to the structure 138. This can be done for example by using a passive probe that contains a permanent magnet 190, or by integrating a permanent magnet with the package. In the presence of the current, this magnetic field B will generate an electromagnetic force on the structure 138 (e.g., trace), which is proportional to the current I and the magnetic field B. Assuming that B is constant, the force will be proportional to the flowing current I. This force will cause the trace and the piezoelectric stack 137 to which it is mechanically coupled to move or deflect. The resulting deformation of the piezoelectric material 134 will generate a voltage between the stack electrodes 132 and 136. This voltage can be measured and then correlated to the applied current using, for example, a look-up table.

Figure 2A:
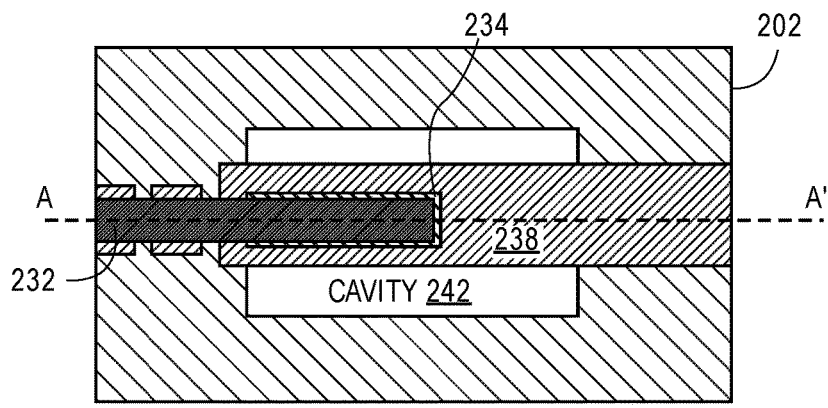
FIG. 2A illustrates a top view of a package substrate having a package-integrated piezoelectric current sensing device, according to an embodiment.
Figure 2B:
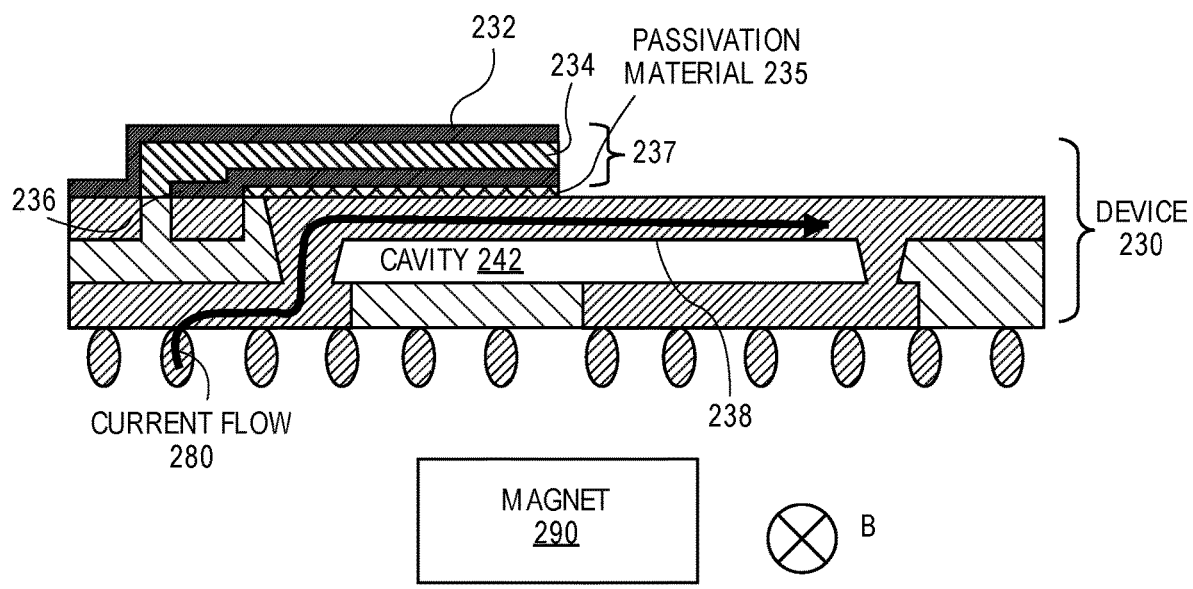
FIG. 2B illustrates a side view (cross-sectional view AA' of FIG. 2A) of a package substrate 250 having a package-integrated piezoelectric current sensing device, according to an embodiment.

FIG. 2A illustrates a top view of a package substrate having a package-integrated piezoelectric current sensing device, according to an embodiment. In one example, the package substrate 200 may be coupled or attached to multiple devices (e.g., die, chip, CPU, silicon die or chip, RF transceiver, etc.) and may be also coupled or attached to a printed circuit board (e.g., PCB 110). FIG. 2B illustrates a side view (cross-sectional view AA' of FIG. 2A) of a package substrate 250 having a package-integrated piezoelectric current sensing device, according to an embodiment. The package substrate 200 (e.g., organic substrate) includes organic dielectric layers 202 and conductive layers 232, 236, and 238. The package substrate 200 can be formed during package substrate processing (e.g., at panel level). A cavity 242 is formed within the packaging substrate 200 by removing one or more layers (e.g., organic layers, dielectric layers, etc.) from the packaging substrate 200. In one example, a piezoelectric current sensing device 230 is formed with conductive moveable structures 232, 236, 238 and piezoelectric material 234. The conductive structure 232 can act as a top electrode and the conductive structure 236 can act as a bottom electrode of the piezoelectric device 230. In one example, the piezoelectric material 234 is disposed on the bottom electrode and the top electrode is disposed on the piezoelectric material. The cavity 242 can be air filled or vacuum filled. The conductive structure 238 is anchored on edges of the cavity by package connections (e.g., anchors, vias) which may serve as both mechanical anchors as well as electrical connections to the rest of the package.

FIGS. 2A and 2B show one configuration in which the movable conductive structure 238 (e.g., trace) can be electromagnetically actuated in the vertical direction. The external magnet 290 can be part of a passive probe to be used by the user performing the current measurement, similar to voltage probes used today in commercial oscilloscopes. Alternatively, it can be a permanent magnet integrated into the package or substrate.

In the presence of the flowing current 280, the magnetic field B will generate an electromagnetic force on the structure 238 (e.g., trace), which is proportional to the current I and the magnetic field B. Assuming that B is constant, the force will be proportional to the flowing current 280. This force will cause the structure 238 and the piezoelectric stack 237 to which it is mechanically coupled to move or deflect. The resulting deformation of the piezoelectric material 234 will generate a voltage across the stack electrodes 232 and 236. This voltage can be measured and then correlated to the applied current using, for example, a look-up table.

Although FIGS. 2A and 2B show one specific trace shape (e.g., straight beam structure 238), other embodiments can have different trace shapes (e.g., meandered beam, curved beam, etc.) or lengths/widths in order to achieve different sensitivities. Different trace shapes provide different mechanical stiffnesses. A geometry of trace shape can be designed for a specific resonant frequency that is tailored for an expected current level to be sensed by the current sensing device. Other embodiments may include different electrode shapes with the electrodes being in the same or different layers and having connections to one or more sides of the cavity (e.g., FIGS. 3A, 3B, 4A, 4B, etc.).

Figure 3A:
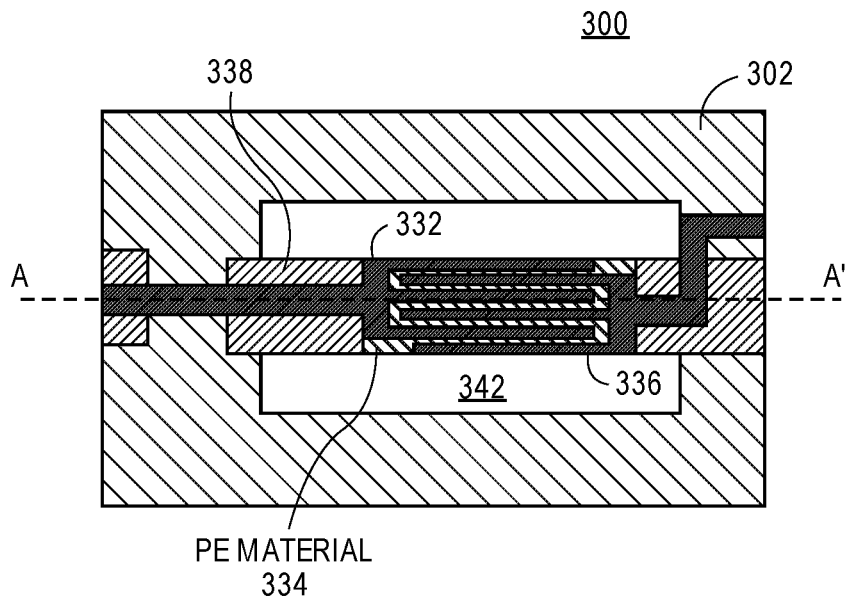
FIG. 3A illustrates a top view of a package substrate having a package-integrated piezoelectric current sensing device, according to an embodiment.
Figure 3B:
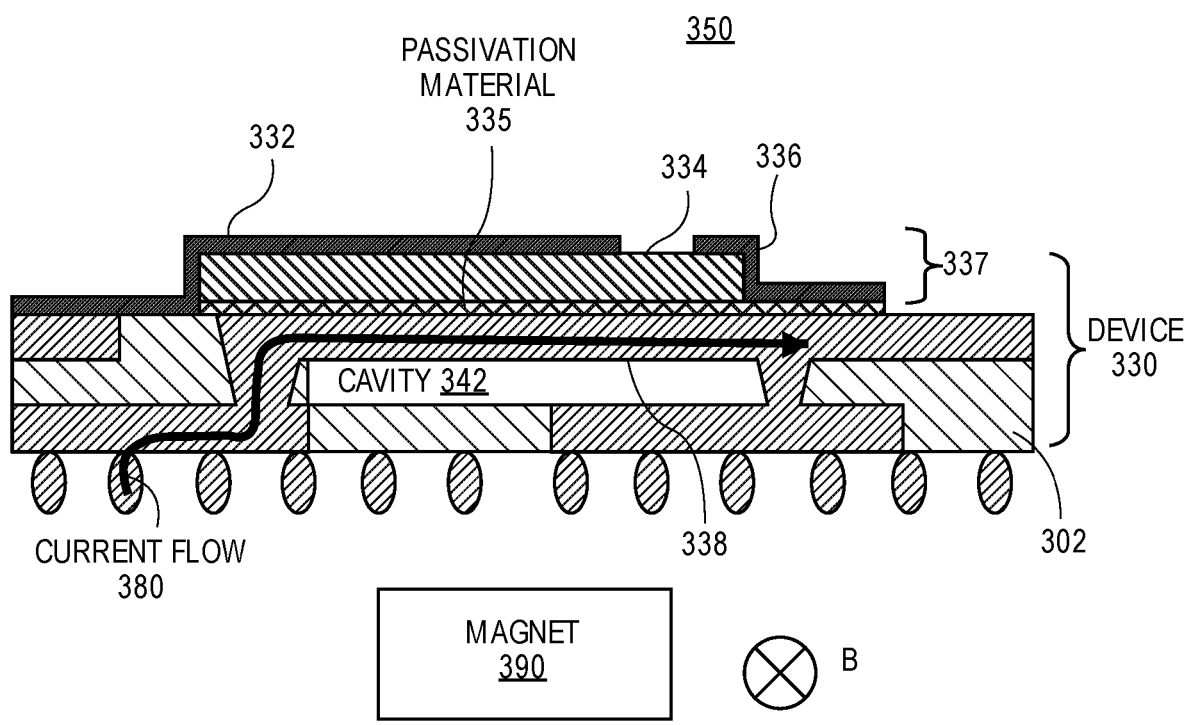
FIG. 3B illustrates a side view (cross-sectional view AA' of FIG. 3A) of a package substrate 350 having a package-integrated piezoelectric current sensing device, according to an embodiment.

FIG. 3A illustrates a top view of a package substrate having a package-integrated piezoelectric current sensing device, according to an embodiment. In one example, the package substrate 300 may be coupled or attached to multiple devices (e.g., die, chip, CPU, silicon die or chip, RF transceiver, etc.) and may be also coupled or attached to a printed circuit board (e.g., PCB 110). FIG. 3B illustrates a side view (cross-sectional view AA' of FIG. 3A) of a package substrate 350 having a package-integrated piezoelectric current sensing device, according to an embodiment. The package substrate (e.g., organic substrate) includes organic dielectric layers 302 and conductive layers 332, 336, and 338. The package substrate 300, 350 can be formed during package substrate processing (e.g., panel level). A cavity 342 is formed within the packaging substrate by removing one or more layers (e.g., organic layers, dielectric layers, etc.) from the packaging substrate. In one example, a piezoelectric current sensing device 330 is formed with conductive moveable structures 332, 336, 338 and piezoelectric material 334. The conductive structure 332 can act as a first electrode and the conductive structure 336 can act as a second electrode of the piezoelectric device 330. In one example, the piezoelectric material 334 is disposed on a passivation material 335 and the first and second electrodes are disposed in an interdigitated manner in a same layer on the piezoelectric material. The cavity 342 can be air filled or vacuum filled. The conductive structure 338 is anchored on edges of the cavity by package connections (e.g., anchors, vias) which may serve as both mechanical anchors as well as electrical connections to the rest of the package.

FIGS. 3A and 3B show one configuration in which the movable conductive structure 338 (e.g., trace) can be electromagnetically actuated in the vertical direction. The external magnet 390 can be part of a passive probe to be used by the user performing the current measurement, similar to voltage probes used today in commercial oscilloscopes. Alternatively, it can be a permanent magnet integrated into the package or substrate.

In the presence of the flowing current 380, the magnetic field B will generate an electromagnetic force on the structure 338 (e.g., trace), which is proportional to the current I and the magnetic field B. Assuming that B is constant, the force will be proportional to the flowing current 380. This force will cause the structure 338 and the piezoelectric stack 337 to which it is mechanically coupled to move or deflect. The resulting deformation of the piezoelectric material 334 will generate a voltage across the stack electrodes 332 and 336. This voltage can be measured and then correlated to the applied current using, for example, a look-up table.

Figure 4A:
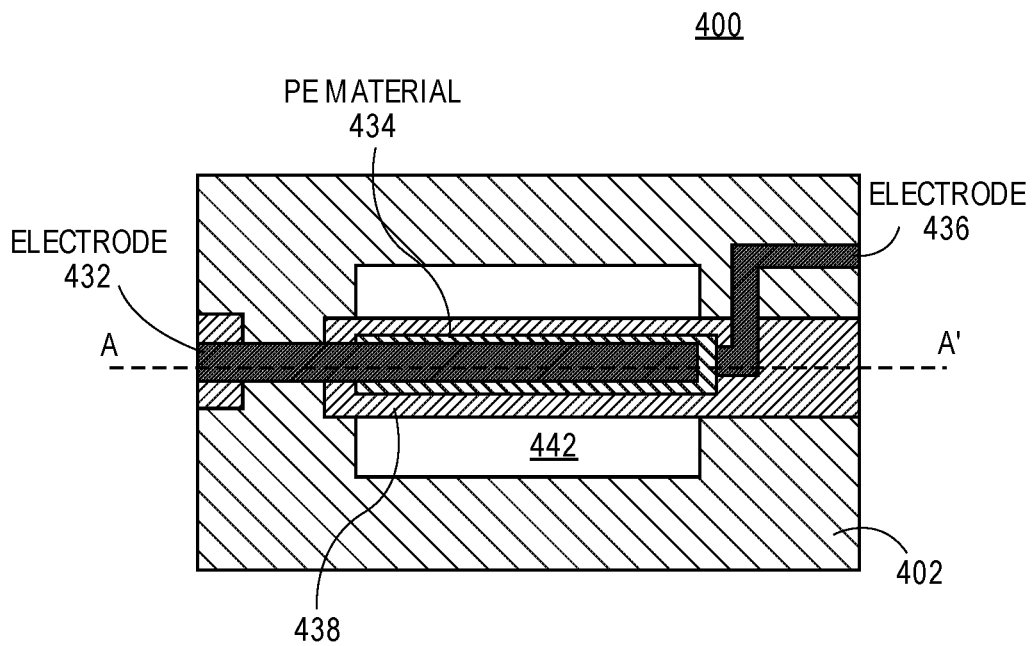
FIG. 4A illustrates a top view of a package substrate having a package-integrated piezoelectric current sensing device, according to an embodiment.
Figure 4B:
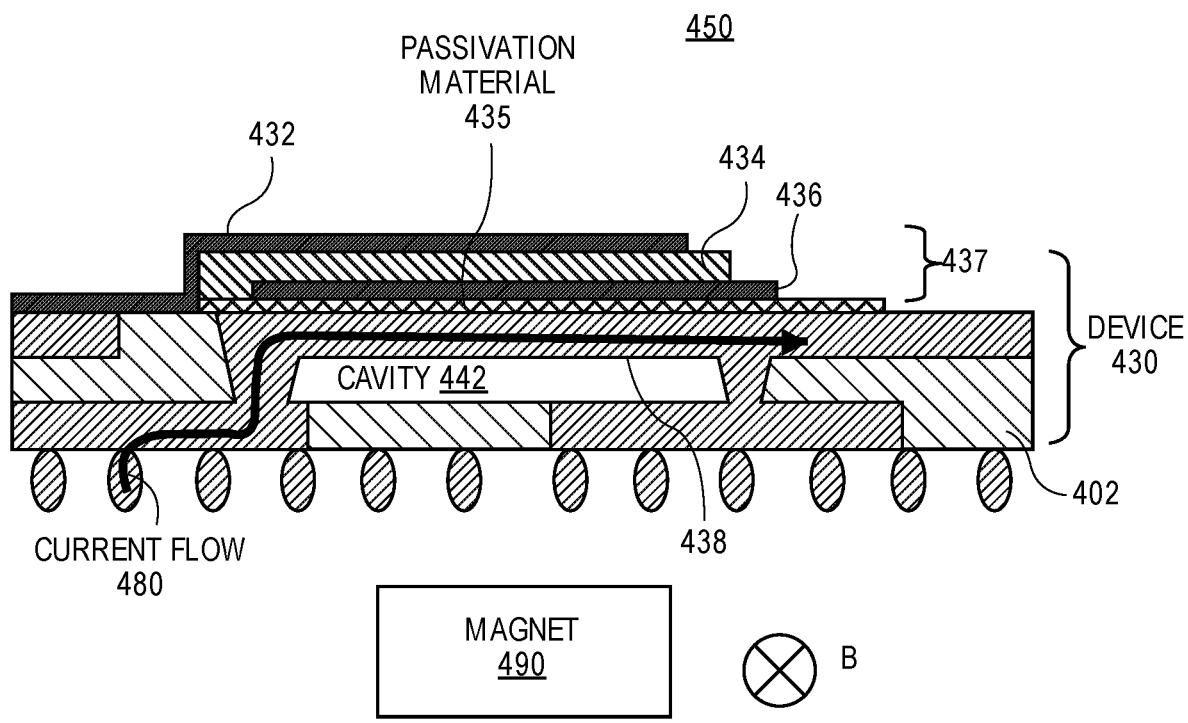
FIG. 4B illustrates a side view (cross-sectional view AA' of FIG. 4A) of a package substrate 450 having a package-integrated piezoelectric current sensing device, according to an embodiment.

FIG. 4A illustrates a top view of a package substrate having a package-integrated piezoelectric current sensing device, according to an embodiment. In one example, the package substrate 400 may be coupled or attached to multiple devices (e.g., die, chip, CPU, silicon die or chip, RF transceiver, etc.) and may be also coupled or attached to a printed circuit board (e.g., PCB 110). FIG. 4B illustrates a side view (cross-sectional view AA' of FIG. 4A) of a package substrate 450 having a package-integrated piezoelectric current sensing device, according to an embodiment. The package substrate 400, 450 (e.g., organic substrate) includes organic dielectric layers 402 and conductive layers 432, 436, and 438. The package substrate 400, 450 can be formed during package substrate processing (e.g., at panel level). A cavity 442 is formed within the packaging substrate by removing one or more layers (e.g., organic layers, dielectric layers, etc.) from the packaging substrate. In one example, a piezoelectric current sensing device 430 is formed with conductive moveable structures 432, 436, 438 and piezoelectric material 434 sandwiched between them. The conductive structure 432 can act as a first electrode and the conductive structure 436 can act as a second electrode of the piezoelectric device 430. In one example, a bottom electrode 436 is disposed on a passivation material 435, the piezoelectric material 434 is disposed on the bottom electrode 436, and the top electrode 432 is disposed on the piezoelectric material 434. The cavity 442 can be air filled or vacuum filled. The conductive structure 438 is anchored on edges of the cavity by package connections (e.g., anchors, vias) which may serve as both mechanical anchors as well as electrical connections to the rest of the package.

FIGS. 4A and 4B show one configuration in which the movable conductive structure 438 (e.g., trace) can be electromagnetically actuated in the vertical direction. The external magnet 490 can be part of a passive probe to be used by the user performing the current measurement, similar to voltage probes used today in commercial oscilloscopes. Alternatively, it can be a permanent magnet integrated into the package or substrate.

In the presence of the flowing current 480, the magnetic field B will generate an electromagnetic force on the structure 438 (e.g., trace), which is proportional to the current I and the magnetic field B. Assuming that B is constant, the force will be proportional to the flowing current 480. This force will cause the structure 438 and the piezoelectric stack 437 to which it is mechanically coupled to move or deflect. The resulting deformation of the piezoelectric material 434 will generate a voltage across the stack electrodes 432 and 436. This voltage can be measured and then correlated to the applied current using, for example, a look-up table.

Figure 5A:
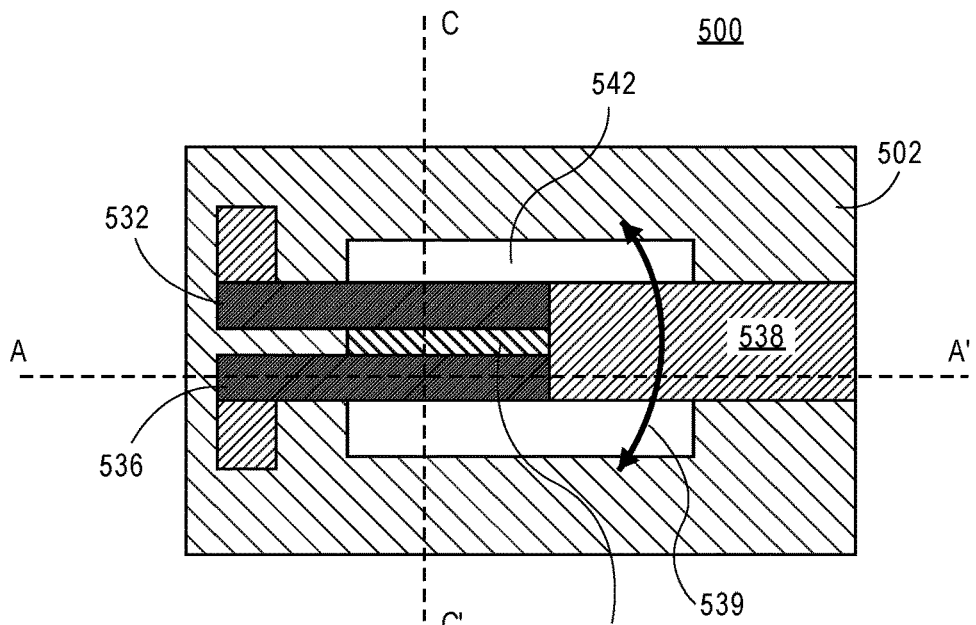
FIG. 5A illustrates a top view of a package substrate having a package-integrated piezoelectric current sensing device, according to an embodiment.
Figure 5B:
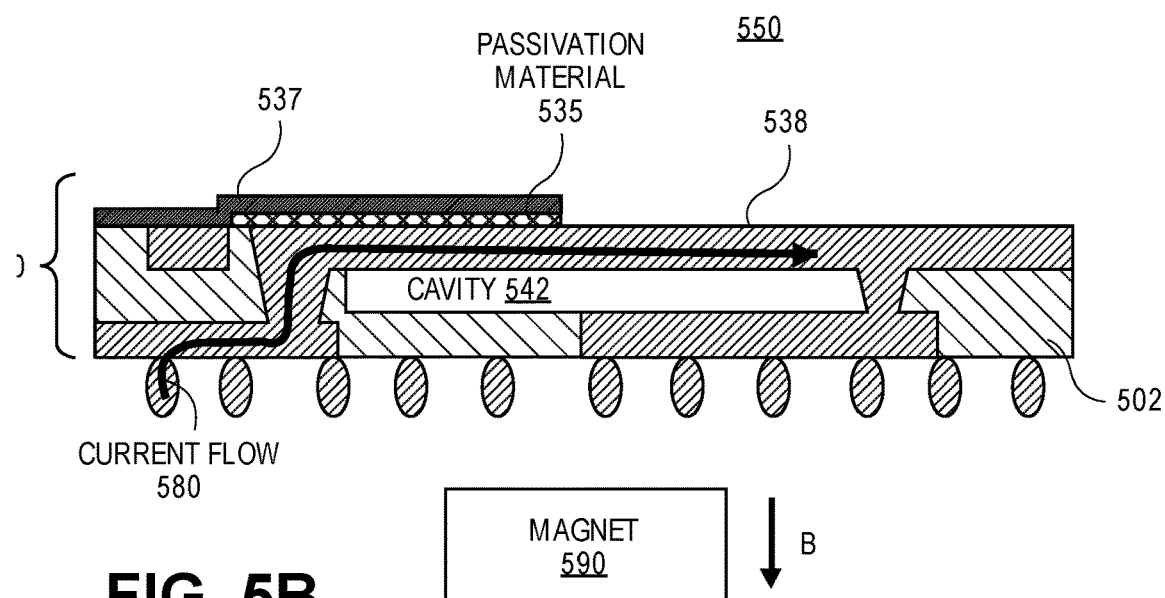
FIG. 5B illustrates a side view (cross-sectional view AA' of FIG. 5A) of a package substrate 550 having a package-integrated piezoelectric current sensing device, according to an embodiment.
Figure 5C:
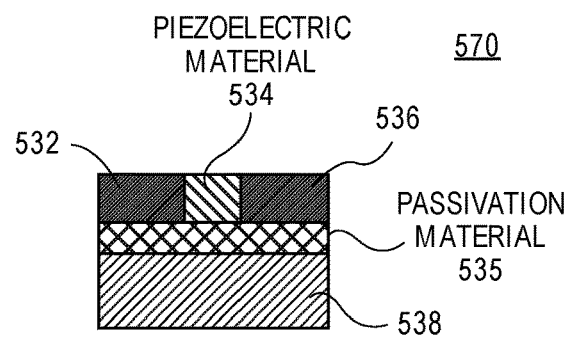
FIG. 5C illustrates a side view (cross-sectional view CC' of FIG. 5A) of a package substrate 570 having a package-integrated piezoelectric current sensing device, according to an embodiment.

FIG. 5A illustrates a top view of a package substrate having a package-integrated piezoelectric current sensing device, according to an embodiment. In one example, the package substrate 500 may be coupled or attached to multiple devices (e.g., die, chip, CPU, silicon die or chip, RF transceiver, etc.) and may be also coupled or attached to a printed circuit board (e.g., PCB 110). FIG. 5B illustrates a side view (cross-sectional view AA' of FIG. 5A) of a package substrate 550 having a package-integrated piezoelectric current sensing device, according to an embodiment. The package substrate 500, 550 (e.g., organic substrate) includes organic dielectric layers 502 and conductive layers 532, 536, and 538. The package substrate 500, 550 can be formed during package substrate processing (e.g., panel level). A cavity 542 is formed within the packaging substrate by removing one or more layers (e.g., organic layers, dielectric layers, etc.) from the packaging substrate. In one example, a piezoelectric current sensing device 530 is formed with conductive moveable structures 532, 536, 538 and piezoelectric material 534 sandwiched between them. The conductive structure 532 can act as a first electrode and the conductive structure 536 can act as a second electrode of a horizontal layer of the piezoelectric device 530 as illustrated in FIG. 5C which represents a side view (cross-sectional view CC') of FIG. 5A of a package substrate 570 in accordance with one embodiment. In one example, the piezoelectric material 534 is positioned between the electrodes 532 and 534 and these materials form a piezoelectric stack 537. An insulating passivation layer 535 electrically isolates the stack 537 from the structure 538. The cavity 542 can be air filled or vacuum filled. The conductive structure 538 is anchored on edges of the cavity by package connections (e.g., anchors, vias) which may serve as both mechanical anchors as well as electrical connections to the rest of the package.

FIGS. 5A, 5B, and 5C show one configuration in which the movable conductive structure 538 (e.g., trace) can be electromagnetically actuated in a horizontal direction 539. The external magnet 590 can be part of a passive probe to be used by the user performing the current measurement, similar to voltage probes used today in commercial oscilloscopes. Alternatively, it can be a permanent magnet integrated into the package or substrate.

In the presence of the flowing current 580, the magnetic field B having a vertical direction will generate an electromagnetic force on the structure 538 (e.g., trace), which is proportional to the current I and the magnetic field B. Assuming that B is constant, the force will be proportional to the flowing current 580. This force will cause the structure 538 and the piezoelectric stack 537 to which it is mechanically coupled to move or deflect. The resulting deformation of the piezoelectric material 534 will generate a voltage across the stack electrodes 532 and 536. This voltage can be measured and then correlated to the applied current using, for example, a look-up table.

Figure 6:
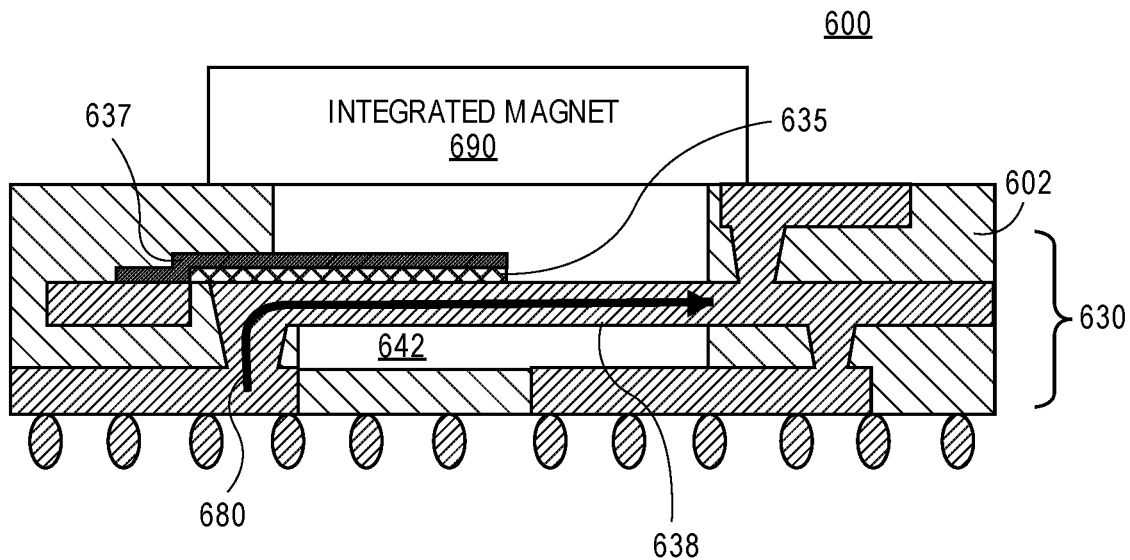
FIG. 6 illustrates a side view of a package substrate having a package-integrated piezoelectric current sensing device and integrated magnet, according to an embodiment.

FIG. 6 illustrates a side view of a package substrate having a package-integrated piezoelectric current sensing device and integrated magnet, according to an embodiment. In one example, the package substrate 600 may be coupled or attached to multiple devices (e.g., die, chip, CPU, silicon die or chip, RF transceiver, etc.) and may be also coupled or attached to a printed circuit board (e.g., PCB 110). The package substrate 600 (e.g., organic substrate) includes organic dielectric layers 602, a piezoelectric stack 637 (e.g., 137, 237, 337, 437, 537, etc.), and a conductive structure 638. The piezoelectric stack 637 includes first and second electrodes and a piezoelectric material. The package substrate 600 can be formed during package substrate processing (e.g., at panel level). A cavity 642 is formed within the packaging substrate by removing one or more layers (e.g., organic layers, dielectric layers, etc.) from the packaging substrate. In one example, a piezoelectric current sensing device 630 is formed with conductive moveable structures including stack 637, structure 638, and piezoelectric material 634. An insulating passivation layer 635 electrically isolates the stack 637 from the structure 638. The cavity 642 can be air filled or vacuum filled. The conductive structure 638 is anchored on edges of the cavity by package connections (e.g., anchors, vias) which may serve as both mechanical anchors as well as electrical connections to the rest of the package.

The magnet 690 is integrated with the package substrate 600 as illustrated in FIG. 6. Alternatively, the magnet 690 can be integrated in a different position of the package substrate 600. In the presence of the flowing current 680, the magnetic field B will generate an electromagnetic force on the structure 638 (e.g., trace), which is proportional to the current I and the magnetic field B. Assuming that B is constant, the force will be proportional to the flowing current 680. This force will cause the structure 638 and the piezoelectric stack 637 to which it is mechanically coupled to move or deflect. The resulting deformation of the piezoelectric material 634 will generate a voltage across the stack electrodes. This voltage can be measured and then correlated to the applied current using, for example, a look-up table.

Figure 7:
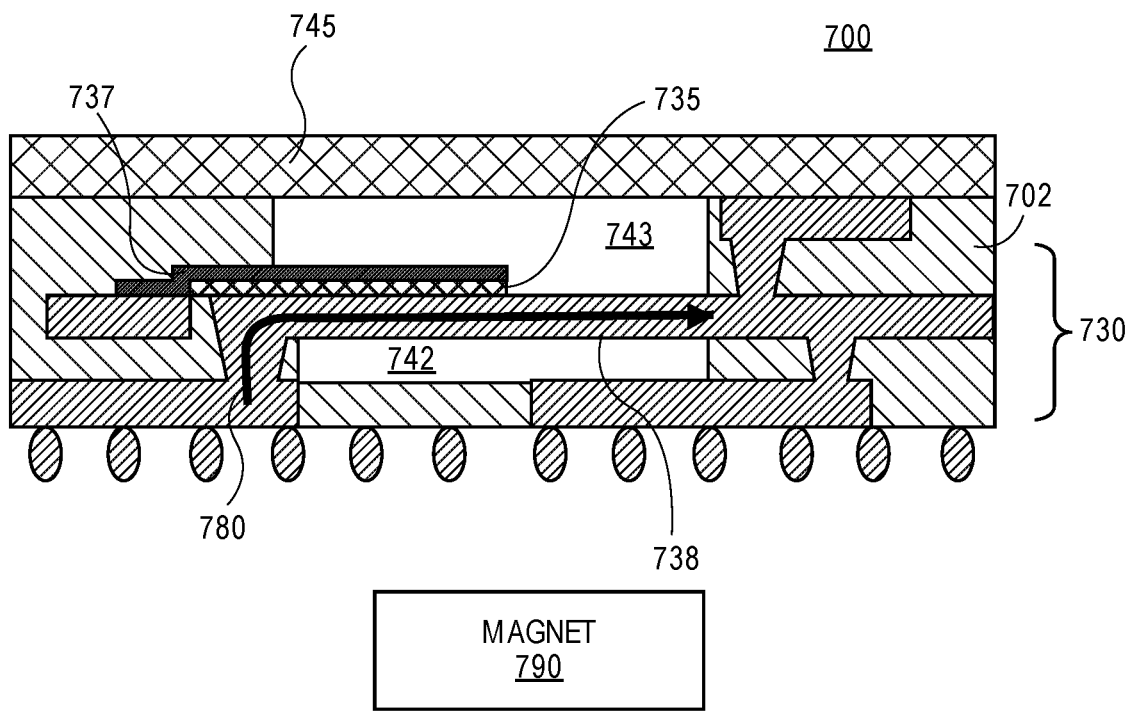
FIG. 7 illustrates a side view of a package substrate having a package-integrated piezoelectric current sensing device, according to an embodiment.

FIG. 7 illustrates a side view of a package substrate having a package-integrated piezoelectric current sensing device, according to an embodiment. In one example, the package substrate 700 may be coupled or attached to multiple devices (e.g., die, chip, CPU, silicon die or chip, RF transceiver, etc.) and may be also coupled or attached to a printed circuit board (e.g., PCB 110). The package substrate 700 (e.g., organic substrate) includes organic dielectric layers 702, a piezoelectric stack 737 (e.g., 137, 237, 337, 437, 537, 637, etc.), and a conductive structure 738. The piezoelectric stack 737 includes first and second electrodes and a piezoelectric material. The package substrate 700 can be formed during package substrate processing (e.g., at panel level). A cavity 742 and a cavity 743 are formed within the packaging substrate by removing one or more layers (e.g., organic layers, dielectric layers, etc.) from the packaging substrate. In one example, a piezoelectric current sensing device 730 is formed with conductive moveable structures including stack 737, structure 738, and piezoelectric material 734. An insulating passivation layer 735 electrically isolates the stack 737 from the structure 738. The cavity 742 can be air filled or vacuum filled. The conductive structure 738 is anchored on edges of the cavity by package connections (e.g., anchors, vias) which may serve as both mechanical anchors as well as electrical connections to the rest of the package. A dielectric layer 745 is disposed on the package substrate 700. The structure 738 is formed within the package substrate 700 with the structure 738 being positioned above cavity 742 and below cavity 743 and layer 745. In other words, the structure 738 (e.g., trace) is inaccessible/internal.

The external magnet 790 can be part of a passive probe to be used by the user performing the current measurement, similar to voltage probes used today in commercial oscilloscopes. Alternatively, it can be a permanent magnet integrated into the package or substrate.

In the presence of the flowing current 780, the magnetic field B will generate an electromagnetic force on the structure 738 (e.g., trace), which is proportional to the current I and the magnetic field B. Assuming that B is constant, the force will be proportional to the flowing current 780. This force will cause the structure 738 and the piezoelectric stack 737 to which it is mechanically coupled to move or deflect. The resulting deformation of the piezoelectric material 734 will generate a voltage across the stack electrodes. This voltage can be measured and then correlated to the applied current using, for example, a look-up table.

Figure 8:
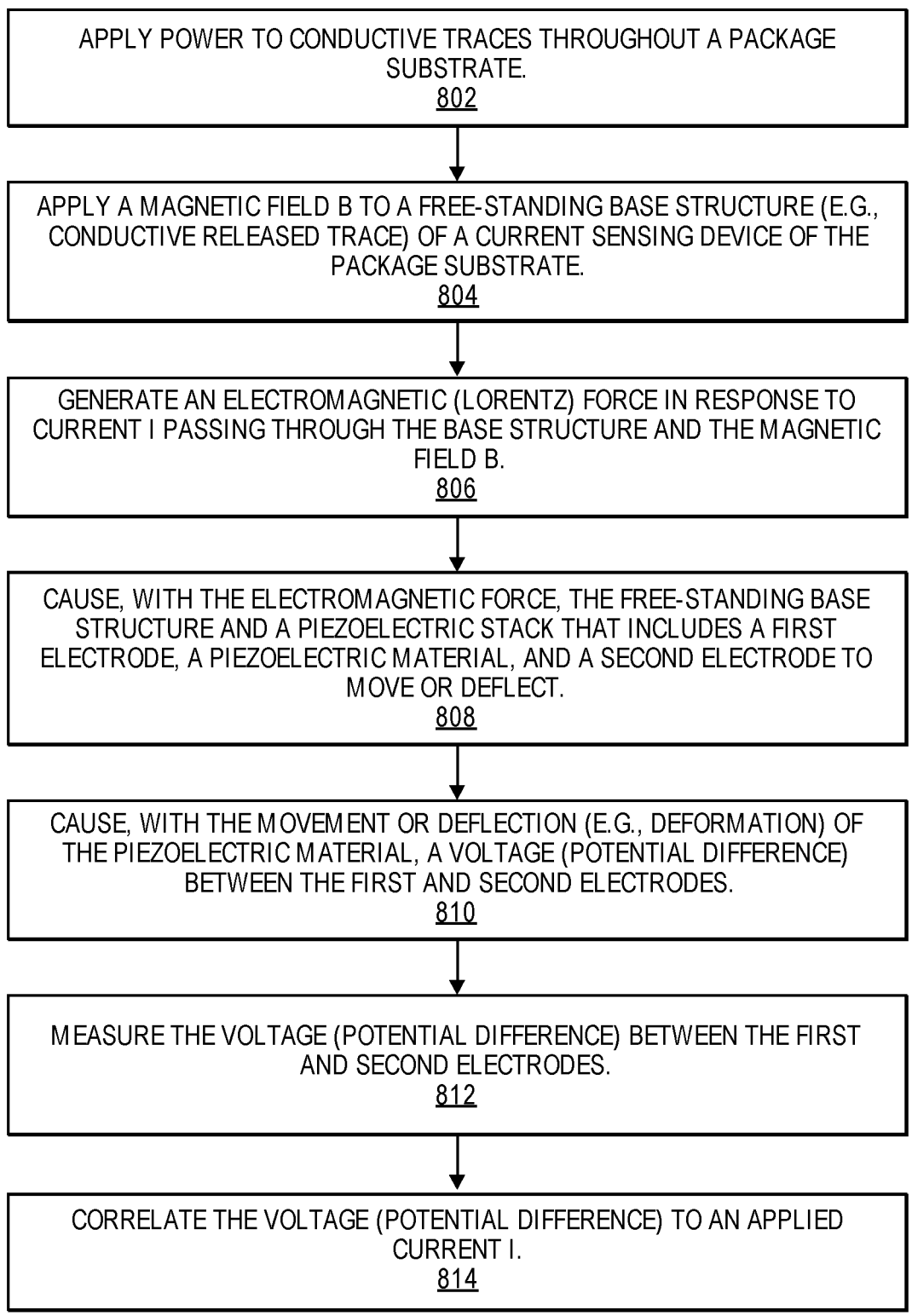
FIG. 8 illustrates a method of in-situ package testing in accordance with one embodiment.

FIG. 8 illustrates a method of in-situ package testing in accordance with one embodiment. The in-situ novel method 800 of non-contact current sensing improves the quality of packages and provides insight into the operating conditions (e.g., maximum allowed current) to be applied during product testing.

At operation 802, power is applied to conductive traces throughout a package substrate. In one example, a CPU may be positioned on a package substrate or coupled to the package substrate. The CPU can be tested for issues in a more effective manner with localized testing with the method 800. Current levels for any traces (internal or external) of the package substrate can be sensed with a non-contact method 800. A current I (AC or DC) passes through a free-standing base structure (e.g., released trace) of a current sensing device that is integrated within an organic package substrate in response to the application of power. At operation 804, an external magnetic field B is applied to the current sensing device. At operation 806, an electromagnetic (Lorentz) force is generated in response to the current I and magnetic field B. The electromagnetic force is proportional to the current I and the magnetic field B. Assuming that B is constant, the force will be proportional to the flowing current I. At operation 808, this electromagnetic force causes the free-standing base structure (e.g., released trace) and a piezoelectric stack to move or deflect. The piezoelectric stack is mechanically coupled to the base structure. The piezoelectric stack includes a first electrode, a piezoelectric material, and a second electrode. The piezoelectric material is interposed between the first and second electrodes. At operation 810, the movement or deflection (e.g., deformation) of the piezoelectric material causes a voltage (potential difference) to be generated between the first and second electrodes. At operation 812, the voltage between the first and second electrodes is measured. At operation 814, the measured voltage is correlated to the applied current I. In one example, a look-up table is used to correlate the voltage with an applied current I. In this manner, the current sensing device determines the current I passing through the base structure by measuring the voltage between the first and second electrodes.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 9:
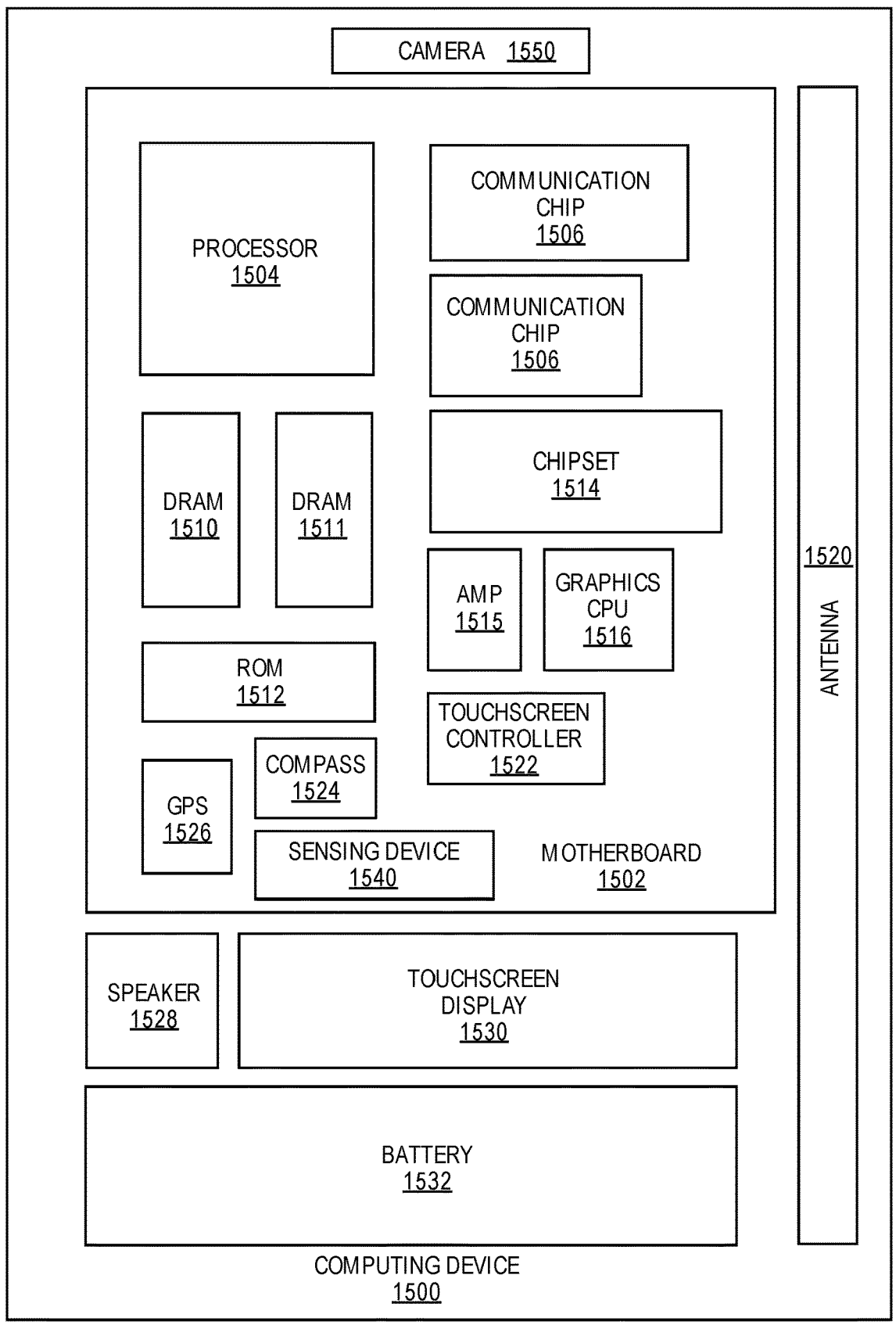
FIG. 9 illustrates a computing device 1500 in accordance with one embodiment of the invention.

FIG. 9 illustrates a computing device 1500 in accordance with one embodiment of the invention. The computing device 1500 houses a board 1502. The board 1502 may include a number of components, including but not limited to a processor 1504 and at least one communication chip 1506. The processor 1504 is physically and electrically coupled to the board 1502. In some implementations the at least one communication chip 1506 is also physically and electrically coupled to the board 1502. In further implementations, the communication chip 1506 is part of the processor 1504.

Depending on its applications, computing device 1500 may include other components that may or may not be physically and electrically coupled to the board 1502. These other components include, but are not limited to, volatile memory (e.g., DRAM 1510, 1511), non-volatile memory (e.g., ROM 1512), flash memory, a graphics processor 1516, a digital signal processor, a crypto processor, a chipset 1514, an antenna 1520, a display, a touchscreen display 1530, a touchscreen controller 1522, a battery 1532, an audio codec, a video codec, a power amplifier 1515, a global positioning system (GPS) device 1526, a compass 1524, a current sensing device 1540 (e.g., a piezoelectric current sensing device), a gyroscope, a speaker, a camera 1550, and a mass storage device (such as hard disk drive, compact disk (CD), digital versatile disk (DVD), and so forth).

The communication chip 1506 enables wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1500 may include a plurality of communication chips 1506. For instance, a first communication chip 1506 may be dedicated to shorter range wireless communications such as Wi-Fi, WiGig and Bluetooth and a second communication chip 1506 may be dedicated to longer range wireless communications such as GPS, EDGE, GPRS, CDMA, WiMAX, LTE, Ev-DO, 5G, and others.

The processor 1504 of the computing device 1500 includes an integrated circuit die packaged within the processor 1504. In some implementations of the invention, the integrated circuit processor package or motherboard 1502 includes one or more devices, such as current sensing devices in accordance with implementations of embodiments of the invention. The term "processor" may refer to any device or portion of a device that processes electronic data from registers and/or memory to transform that electronic data into other electronic data that may be stored in registers and/or memory. The communication chip 1506 also includes an integrated circuit die packaged within the communication chip 1506. The following examples pertain to further embodiments. Example 1 is a current sensing device comprising a released base structure that is positioned in proximity to a cavity of an organic substrate and a piezoelectric film stack positioned in proximity to the released base structure. The piezoelectric film stack includes a piezoelectric material in contact with first and second electrodes. A magnetic field is applied to the current sensing device and this causes movement of the released base structure and the piezoelectric stack which induces a voltage (potential difference) between the first and second electrodes.

In example 2, the subject matter of example 1 can optionally include the current sensing device being integrated with the organic substrate which is fabricated using panel level processing.

In example 3, the subject matter of any of examples 1-2 can optionally include the released base structure being positioned above the cavity of the organic substrate to allow movement of the released base structure and the released base structure is embedded within the organic substrate.

In example 4, the subject matter of any of examples 1-3 can optionally include the voltage being measured between the first and second electrodes and this voltage is correlated with an applied current passing through the released base structure.

In example 5, the subject matter of any of examples 1-4 can optionally include the piezoelectric stack being mechanically coupled to the released base structure to cause movement of the piezoelectric stack in response to movement of the released base structure.

In example 6, the subject matter of any of examples 1-5 can optionally include an insulating layer interposed between the piezoelectric stack and the release base structure.

In example 7, the subject matter of any of examples 1-6 can optionally include a magnet to generate the magnetic field with the magnet being external to the organic substrate or integrated with the organic substrate.

In example 8, the subject matter of any of examples 1-7 can optionally include movement of the released base structure causing the piezoelectric stack to move in a vertical direction out of a plane of the organic substrate.

In example 9, the subject matter of any of examples 1-8 can optionally include movement of the released base structure causing the piezoelectric stack to move in a horizontal direction in a plane of the organic substrate.

Example 10 is a package substrate comprising a plurality of organic dielectric layers and a plurality of conductive layers to form the package substrate, a cavity formed in the package substrate and a piezoelectric current sensing device integrated within the package substrate. The piezoelectric current sensing device comprises a released base structure that is positioned in proximity to the cavity and a piezoelectric film stack that includes a piezoelectric material in contact with first and second electrodes. A magnetic field is applied to the current sensing device and this causes movement of the released base structure and the piezoelectric stack which induces a voltage between the first and second electrodes.

In example 11, the subject matter of example 10 can optionally include the released base structure being positioned above the cavity of the organic substrate to allow movement of the released base structure and the released base structure being embedded within the package substrate.

In example 12, the subject matter of any of examples 10-11 can optionally include the voltage being measured between the first and second electrodes and this voltage is correlated with an applied current passing through the released base structure.

In example 13, the subject matter of any of examples 10-12 can optionally include the piezoelectric stack being mechanically coupled to the released base structure to cause movement of the piezoelectric stack in response to movement of the released base structure.

In example 14, the subject matter of any of examples 10-13 can optionally include a magnet to generate the magnetic field with the magnet being external to the organic substrate or integrated with the organic substrate.

In example 15, the subject matter of any of examples 10-14 can optionally include movement of the released base structure causing the piezoelectric stack to move in a vertical direction out of a plane of the package substrate or in a horizontal direction in the plane of the package substrate.

Example 16 is a method of current sensing that comprises applying a magnetic field to a free-standing base structure of a current sensing device that is integrated within an organic package substrate, generating an electromagnetic force in response to a current passing through the base structure and the magnetic field, causing the base structure and a piezoelectric stack that includes a first electrode, a piezoelectric material, and a second electrode to move in response to the electromagnetic force, and in response to the movement, inducing a voltage between the first and second electrodes.

In example 17, the subject matter of example 16 can optionally include measuring the voltage (potential difference) between the first and second electrodes to determine the current passing through the base structure.

In example 18, the subject matter of any of examples 16-18 can optionally include the piezoelectric stack being mechanically coupled to the base structure.

Example 19 is a computing device comprising at least one processor to process data and a package substrate coupled to the at least one processor. The package substrate includes a plurality of organic dielectric layers and a plurality of conductive layers to form the package substrate which includes a piezoelectric current sensing device having a released base structure that is positioned in proximity to a cavity of the package substrate and a piezoelectric film stack that includes a piezoelectric material in contact with first and second electrodes. A magnetic field is applied to the current sensing device and this causes movement of the released base structure and the piezoelectric stack which induces a voltage between the first and second electrodes.

In example 20, the subject matter of example 19 can optionally include the released base structure being positioned above the cavity of the organic substrate to allow movement of the released base structure and the released base structure being embedded within the package substrate.

In example 21, the subject matter of any of examples 19-20 can optionally include the voltage being measured between the first and second electrodes and this voltage is correlated with an applied current passing through the released base structure.

In example 22, the subject matter of any of examples 19-21 can optionally include a printed circuit board coupled to the package substrate.

The invention claimed is:

1. A current sensing device, comprising:
   a released base structure that is positioned in proximity to a cavity of an organic substrate, wherein the released base structure is a conductive structure; and
   a piezoelectric film stack positioned in proximity to the released base structure, the piezoelectric film stack includes a piezoelectric material in contact with first and second electrodes, wherein a magnetic field is applied to the current sensing device and this causes movement of the released base structure and the piezoelectric stack which induces a voltage between the first and second electrodes.

2. The current sensing device of claim 1, wherein the current sensing device is integrated with the organic substrate which is fabricated using panel level processing.

3. The current sensing device of claim 2, wherein the released base structure is positioned above the cavity of the organic substrate to allow movement of the released base structure and the released base structure is embedded within the organic substrate.

4. The current sensing device of claim 1, wherein the voltage is measured between the first and second electrodes and this voltage is correlated with an applied current passing through the released base structure.

5. The current sensing device of claim 1, wherein the piezoelectric stack is mechanically coupled to the released base structure to cause movement of the piezoelectric stack in response to movement of the released base structure.

6. The current sensing device of claim 5, further comprising:
   a passivation layer interposed between the piezoelectric stack and the release base structure.

7. The current sensing device of claim 6, further comprising:
   a magnet to generate the magnetic field with the magnet being external to the organic substrate or integrated with the organic substrate.

8. The current sensing device of claim 5, further comprising:
   a passivation layer interposed between the piezoelectric stack and the release base structure.

9. The current sensing device of claim 1, wherein movement of the released base structure causes the piezoelectric stack to move in a vertical direction out of a plane of the organic substrate.

10. The current sensing device of claim 1, wherein movement of the released base structure causes the piezoelectric stack to move in a horizontal direction in a plane of the organic substrate.

11. A package substrate comprising:
    a plurality of alternating organic dielectric layers and conductive layers to form the package substrate;
    a cavity formed in the package substrate; and
    a piezoelectric current sensing device integrated within the package substrate, wherein the piezoelectric current sensing device comprises a released base structure that is positioned in proximity to the cavity and a piezoelectric film stack that includes a piezoelectric material in contact with first and second electrodes, wherein the released base structure is a conductive structure, and wherein a magnetic field is applied to the current sensing device and this causes movement of the released base structure and the piezoelectric stack which induces a voltage between the first and second electrodes.

12. The package substrate of claim 11, wherein the released base structure is positioned above the cavity of the organic substrate to allow movement of the released base structure and the released base structure is embedded within the package substrate.

13. The package substrate of claim 12, wherein the voltage is measured between the first and second electrodes and this voltage is correlated with an applied current passing through the released base structure.

14. The package substrate of claim 11, wherein the piezoelectric stack is mechanically coupled to the released base structure to cause movement of the piezoelectric stack in response to movement of the released base structure.

15. The package substrate of claim 11, further comprising: a magnet to generate the magnetic field with the magnet being external to the organic substrate or integrated with the organic substrate.

16. The package substrate of claim 11, wherein movement of the released base structure causes the piezoelectric stack to move in a vertical direction out of a plane of the package substrate or in a horizontal direction in the plane of the package substrate.

17. A computing device comprising:
at least one processor die to process data; and
a package substrate coupled to the at least one processor, wherein the package substrate includes a plurality of alternating organic dielectric layers and conductive layers to form the package substrate which includes a piezoelectric current sensing device having a released base structure that is positioned in proximity to a cavity of the package substrate and a piezoelectric film stack that includes a piezoelectric material in contact with first and second electrodes, wherein the released base structure is a conductive structure, and wherein a magnetic field is applied to the current sensing device and this causes movement of the released base structure and the piezoelectric stack which induces a voltage between the first and second electrodes.

18. The computing device of claim 17, wherein the released base structure is positioned above the cavity of the organic substrate to allow movement of the released base structure and the released base structure is embedded within the package substrate.

19. The computing device of claim 17, wherein the voltage is measured between the first and second electrodes and this voltage is correlated with an applied current passing through the released base structure.

20. The computing device of claim 17, further comprising:
a printed circuit board coupled to the package substrate.

21. A current sensing device, comprising:
a released base structure that is positioned in proximity to a cavity of an organic substrate, wherein the released base structure is a conductive structure; and
a piezoelectric film stack positioned in proximity to the released base structure, the piezoelectric film stack includes a piezoelectric material in contact with first and second electrodes.

22. The current sensing device of claim 21, wherein the piezoelectric stack is mechanically coupled to the released base structure to cause movement of the piezoelectric stack in response to movement of the released base structure.

* * * * *